(12) United States Patent
Tanigawa et al.

(10) Patent No.: US 10,598,742 B2
(45) Date of Patent: Mar. 24, 2020

(54) MAGNETIC FIELD DETECTION SENSOR

(71) Applicant: Yazaki Corporation, Minato-ku, Tokyo (JP)

(72) Inventors: Junya Tanigawa, Susono (JP); Hiroki Sugiyama, Susono (JP); Makoto Ishii, Susono (JP)

(73) Assignee: Yazaki Corporation, Minato-ku, Tokyo (JP)

( * ) Notice: Subject to any disclaimer, the term of this patent is extended or adjusted under 35 U.S.C. 154(b) by 68 days.

(21) Appl. No.: 15/965,198

(22) Filed: Apr. 27, 2018

(65) Prior Publication Data

US 2018/0329001 A1 Nov. 15, 2018

(30) Foreign Application Priority Data

May 11, 2017 (JP) .................................. 2017-094911

(51) Int. Cl.
*G01R 33/06* (2006.01)

(52) U.S. Cl.
CPC .................................. *G01R 33/063* (2013.01)

(58) Field of Classification Search
CPC ...... G01R 33/06; G01R 33/063; G01R 15/20; G01R 1/30; G01R 19/00; G01R 19/0092
See application file for complete search history.

(56) References Cited

U.S. PATENT DOCUMENTS

| 5,764,055 | A | 6/1998 | Kawase | |
|---|---|---|---|---|
| 6,028,427 | A | 2/2000 | Kawase | |
| 6,232,775 | B1* | 5/2001 | Naitoh | C22C 38/10 148/305 |
| 8,295,382 | B2 | 10/2012 | Xu et al. | |
| 10,254,315 | B2 | 4/2019 | Higashi et al. | |
| 2009/0302837 | A1 | 12/2009 | Phan Le et al. | |
| 2015/0177285 | A1 | 6/2015 | Higashi et al. | |
| 2016/0245879 | A1 | 8/2016 | Tanigawa et al. | |
| 2017/0160351 | A1* | 6/2017 | Yamamoto | G01C 17/30 |

FOREIGN PATENT DOCUMENTS

| JP | H09-127218 A | 5/1997 |
|---|---|---|
| JP | 2000-180521 A | 6/2000 |
| JP | 2008-516225 A | 5/2008 |
| JP | 2015-092144 A | 5/2015 |
| JP | 2015-125020 A | 7/2015 |

* cited by examiner

*Primary Examiner* — Son T Le
(74) *Attorney, Agent, or Firm* — Banner & Witcoff, Ltd.

(57) ABSTRACT

Magnetic members of a high-sensitivity magnetoimpedance element and a low-sensitivity magnetoimpedance element are connected to each other in series, and the strength and direction of an external magnetic field is detected on the basis of an impedance variation of this series circuit. The output of a magnetic field detection sensor mainly reflects an impedance variation of the high-sensitivity magnetoimpedance element in a weak magnetic field range, and mainly reflects an impedance variation of the low-sensitivity magnetoimpedance element in a strong magnetic field range, whereby continuous detection is enabled in a wide range from a weak magnetic field to a strong magnetic field.

5 Claims, 10 Drawing Sheets

MAGNETIC FIELD DETECTION SENSOR

CROSS REFERENCE TO RELATED APPLICATIONS

This application is based on and claims priority from Japanese patent application No. 2017-094911 filed on May 11, 2017, the entire contents of which are incorporated herein by reference.

BACKGROUND OF THE INVENTION

1. Technical Field

The present invention relates to a magnetic field detection sensor that utilizes the magnetoimpedance effect.

2. Background Art

For example, Patent documents JP-A-9-127218, JP-A-2000-180521, and JP-A-2015-92144 disclose conventional techniques relating to a magnetic sensor using a magnetism detection element (MI element) that utilizes the magnetoimpedance effect. The impedance of a high-permeability alloy magnetic body such as an amorphous alloy wire varies sensitively according to an external magnetic field due to the skin effect. This phenomenon is the magnetoimpedance effect.

In the configuration disclosed in Patent document JP-A-9-127218, an MI element is incorporated in a Colpitts oscillator. An AC bias magnetic field is applied to the MI element by causing an AC bias current to flow through a coil that is wound around the MI element. An amplitude modulation waveform that reflects an impedance variation of the MI element that occurs according to an external magnetic field and the bias magnetic field is obtained at the output of the oscillator. A peak-to-peak value of the amplitude modulation waveform corresponds to the strength of the external magnetic field. Thus, an output signal having a pulse-width-modulated digital waveform is obtained by detecting the amplitude modulation waveform, eliminating a DC component, and performing voltage comparison by a comparator. That is, the strength of the external magnetic field is determined on the basis of an amplitude variation at the output of the oscillator.

In the configuration disclosed in Patent document JP-A-2000-180521, a radio-frequency sinusoidal current that is output from an oscillation circuit is applied between the two ends of a magnetic core of a thin-film magnetoimpedance element via a buffer circuit. A detector circuit detects a magnetism variation amount of an external magnetic field applied to the magnetoimpedance element from a variation of the radio-frequency current that varies according to the external magnetic field. A hysteresis cancellation circuit for canceling hysteresis of the magnetoimpedance element is also provided. A current is caused to flow through a bias coil to move the operating point of the magnetoimpedance element, and a current is caused to flow through a negative feedback coil according to the detected magnetic field.

Patent document JP-A-2015-92144 discloses a magnetic field detection sensor that employs a magnetoimpedance element having a special configuration. More specifically, in this magnetoimpedance element, its longitudinal axis is made a magnetic field detecting direction and a magnetic film is given such magnetic anisotropy that its easy magnetization axis extends parallel with its longitudinal direction. The magnetoimpedance characteristic can be made a pyramid type by setting the magnetic field detecting direction and the easy magnetization axis parallel with each other. This makes it unnecessary to apply DC and AC biases to such an extent that a portion having a steep slope is reached as in the case of an M-shaped characteristic. Furthermore, the detection accuracy can be increased because the pyramid-shaped characteristic is smaller in hysteresis than the M-shaped characteristic and the detection range can be broadened because the pyramid-shaped characteristic has a prescribed slope over the entire range. As a result, the detection accuracy can be increased while the current consumption is lowered, and a wide detection range can be obtained.

SUMMARY

However, the conventional magnetic field detection sensors utilizing the magnetoimpedance effect that are disclosed in Patent documents JP-A-9-127218 and JP-A-2000-180521 have the following problems:

(1) The range of magnetic field detection is narrow.

(2) Since the magnetoimpedance characteristic of the magnetoimpedance element is M-shaped, in the case where an AC bias is used, a high-sensitivity measurement cannot be performed without applying an AC bias to such an extent that a steep-slope portion is reached. This increases the current consumption.

(3) Exhibiting an M-shaped magnetoimpedance characteristic, the magnetoimpedance element is larger in hysteresis than a magnetoimpedance element having a pyramid-shaped magnetoimpedance characteristic. This lowers the detection accuracy.

On the other hand, the conventional magnetic field detection sensor disclosed in Patent document JP-A-2015-92144 which employs the magnetoimpedance element that exhibits a pyramid-shaped magnetoimpedance characteristic is improved in the above items (2) and (3). However, where a magnetic field is detected using the circuit having the configuration shown in FIG. 1 of Patent document JP-A-2015-92144, if an external magnetic field is too strong, necessary pulses do not appear at the output of a differentiation circuit shown in FIG. 6(d) of Patent document JP-A-2015-92144 to incur a state that a phase of such pulses cannot be detected and hence detection of a magnetic field is disabled. Thus, the problem of the above item (1) cannot be solved.

Furthermore, even in the conventional magnetic field detection sensor disclosed in Patent document JP-A-2015-92144 which employs the magnetoimpedance element that exhibits a pyramid-shaped magnetoimpedance characteristic, the slope is smaller in end portions of the pyramid-shaped characteristic. Thus, in a strong magnetic field range, an impedance variation corresponding to a difference in the strength of a magnetic field is small, which leads to difficulty in detecting a strong magnetic field. In particular, a strong magnetic field cannot be detected if detection of a weak magnetic field is enabled by increasing the detection sensitivity of the sensor.

The present invention has been made in view of the above circumstances, and an object of the invention is therefore to provide a magnetic field detection sensor capable of broadening a magnetic field detection range.

To attain the above object, the invention provides magnetic field detection sensors of the following items (1) to (5):

(1) A magnetic field detection sensor, comprising:
a magnetism detection device having magnetic members exhibiting a magnetoimpedance effect and bias coils which apply bias magnetic fields to the respective magnetic members;
a radio-frequency oscillation circuit which supplies a radio-frequency current to the magnetic members; and
an AC bias circuit which supplies AC bias currents to the respective bias coils, wherein:
the magnetism detection device comprises a first magnetism detection element and a second magnetism detection element capable of detecting a stronger magnetic field than the first magnetism detection element; and
the magnetic field detection sensor generates a signal that reflects magnetism detection states of both of the first magnetism detection element and the second magnetism detection element.

(2) The magnetic field detection sensor according to item (1), wherein the magnetic member of the first magnetism detection element and the magnetic member of the second magnetism detection element are electrically connected to each other in series.

(3) The magnetic field detection sensor according to item (1), wherein the first magnetism detection element and the second magnetism detection element are arranged adjacent to each other in such a manner that a magnetosensitive axis of the magnetic member of the first magnetism detection element and a magnetosensitive axis of the magnetic member of the second magnetism detection element are parallel with each other.

(4) The magnetic field detection sensor according to item (1), wherein the magnetic member of the first magnetism detection element and the magnetic member of the second magnetism detection element are connected to each other in series as constituent elements of an electric circuit that constitutes a bridge circuit.

(5) The magnetic field detection sensor according to according item (1), wherein:
the magnetic field detection sensor further comprises a detection circuit which outputs an electrical signal that varies according to an impedance variation from an impedance at a reference point that corresponds to an external magnetic field being equal to zero and where the magnetism detection device exhibits a maximum impedance in a characteristic of the magnetism detection device; and
the detection circuit comprises an amplitude detection circuit which detects at least amplitudes at peak time points when a voltage variation direction of the electrical signal changes.

According to the magnetic field detection sensor of item (1) in which the first magnetism detection element and the second magnetism detection element exhibit different detection characteristics, a magnetic field can be detected in a weak magnetic field range mainly using the detection characteristic of the first magnetism detection element. In a strong magnetic field range, a magnetic field can be detected mainly using the detection characteristic of the second magnetism detection element. Thus, a magnetic field can be detected in a wide range from a weak magnetic field to a strong magnetic field.

According to the magnetic field detection sensor of item (2), since the first magnetism detection element and the second magnetism detection element are connected to each other in series, a magnetic field can be detected in a wide range from a weak magnetic field to a strong magnetic field according to an impedance variation of the whole series circuit. That is, a magnetic field can be detected in a wide range without switching between detection ranges or magnetoimpedance elements.

According to the magnetic field detection sensor of item (3), the first magnetism detection element and the second magnetism detection element can detect magnetic fields in the same direction at the same time under approximately the same conditions. This prevents the detection characteristic of the magnetism detection device from becoming inconsistent between a weak magnetic field range and a strong magnetic field range.

According to the magnetic field detection sensor of item (4) which employs the bridge circuit, the magnetic field detection sensor is less prone to be affected by a power source voltage variation, a temperature variation, etc. and hence is increased in detection accuracy.

In the magnetic field detection sensor of item (5), the amplitude at each peak time point when the voltage variation direction of the electrical signal changes is varied due to the influence of an external magnetic field applied to the magnetism detection device. Thus, the strength of the external magnetic field can be detected by detecting such amplitudes by the amplitude detection circuit. Furthermore, since an amplitude variation can be detected even in the case of a strong external magnetic field, the magnetic field detection range can be broadened. Still further, since an impedance variation from the impedance at the reference point is detected, it is not necessary to cause a flow of a large bias current to move the operating point, as a result of which increase in current consumption can be suppressed.

According to the magnetic field detection sensor of the invention in which the first magnetism detection element and the second magnetism detection element exhibit different detection characteristics, a magnetic field can be detected in a weak magnetic field range mainly using the detection characteristic of the first magnetism detection element. In a strong magnetic field range, a magnetic field can be detected mainly using the detection characteristic of the second magnetism detection element. As a result, a magnetic field can be detected in a wide range from a weak magnetic field to a strong magnetic field.

The invention has been described above concisely. The details of the invention will become more apparent when the modes for carrying out the invention (hereinafter referred to as an embodiment) described below are read through with reference to the accompanying drawings.

DETAILED DESCRIPTION OF EMBODIMENTS

A specific embodiment of the present invention will be hereinafter described with reference to the drawings.
<Example Configuration of Magnetic Field Detection Sensor 200>

Figure 1:
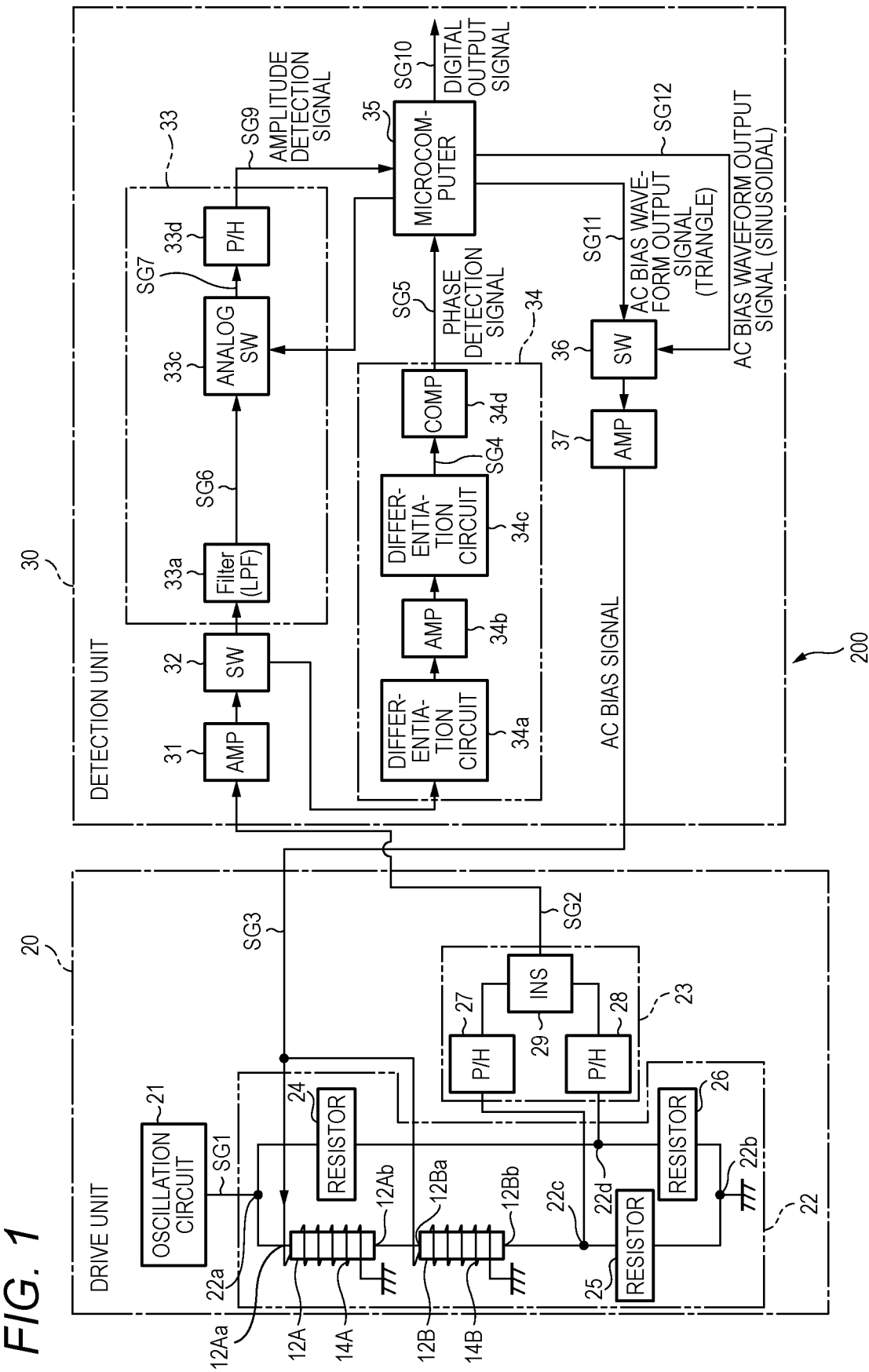
FIG. 1 is a block diagram showing an example configuration of a magnetic field detection sensor according to an embodiment of the present invention.

FIG. 1 shows an example configuration of a magnetic field detection sensor 200 according to the embodiment of the invention.

The magnetic field detection sensor 200 shown in FIG. 1 is composed of a drive unit 20 and a detection unit 30. As described later in detail, each of magnetoimpedance elements 12A and 12B which are included in the drive unit 20 includes a magnetic member that exhibits the magnetoimpedance effect. The magnetic field detection sensor 200 detects an external magnetic field utilizing the two magnetoimpedance elements 12A and 12B.

The two magnetoimpedance elements 12A and 12B have different magnetism detection characteristics. More specifically, the magnetoimpedance element 12A has relatively high sensitivity and the magnetoimpedance element 12B has low sensitivity. That is, whereas the magnetoimpedance element 12A can detect a relatively weak external magnetic field, the magnetoimpedance element 12B is too low in sensitivity to have an ability to detect a weak external magnetic field. Using the two magnetoimpedance elements 12A and 12B in combination provides a special effect as described later. The difference in sensitivity between the two magnetoimpedance elements 12A and 12B can be realized by utilizing shape anisotropy or adjusting dimensions or shapes or combination of these.

The drive unit 20 shown in FIG. 1 is equipped with an oscillation circuit 21, a bridge circuit 22, and a signal processing unit 23. The bridge circuit 22, which is a full bridge circuit, is composed of the two magnetoimpedance elements 12A and 12B and three resistors 24, 25, and 26.

The magnetic members, having ends in their longitudinal directions, of the two magnetoimpedance elements 12A and 12B are connected to each other in series, and the two ends of the resulting series circuit are connected to the other part of the bridge circuit 22. More specifically, one end 12Ab of the magnetic member of the magnetoimpedance element 12A and one end 12Ba of the magnetoimpedance element 12B are connected to each other. The other end 12Aa of magnetoimpedance element 12A is connected to the output of the oscillation circuit 21 and one end of the resistor 24. The other end 12Bb of the magnetoimpedance element 12B is connected to one end of the resistor 25.

Bias coils 14A and 14B which are wound around the magnetic members of the two magnetoimpedance elements 12A and 12B, respectively, are provided to apply AC bias magnetic fields to the respective magnetic members. In the embodiment, the bias coils 14A and 14B are also used to generate magnetic fields for negative feedback. An AC bias signal SG3 is applied to one end of each of the bias coils 14A and 14B. The other ends of the bias coils 14A and 14B are grounded. The AC bias signal SG3 basically has a waveform that is selected by switching of a switch circuit 36.

The series circuit of the two magnetoimpedance elements 12A and 12B is connected, as one resistor, to the other part of the bridge circuit 22. Each of the two magnetoimpedance elements 12A and 12B has a characteristic that it exhibits a maximum impedance (DC resistance) in a state (reference state) that it receives no external magnetic field. The resistances of the resistors 24, 25, and 26 are set so that the bridge circuit 22 is balanced in a state that the two magnetoimpedance elements 12A and 12B exhibit the maximum impedances.

Input-side terminals 22a and 22b of the bridge circuit 22 are connected to the output of the oscillation circuit 21 and the ground, respectively. The oscillation circuit 21 supplies a radio-frequency (high-frequency) signal having a frequency of several tens of megahertz, for example, to the bridge circuit 22 as a signal SG1. The waveform of the signal SG1 is a rectangular wave, a sinusoidal wave, or a triangular wave.

Output-side terminals 22c and 22d of the bridge circuit 22 are connected to respective input terminals of the signal processing unit 23. The signal processing unit 23 is equipped with two peak-hold circuits (P/H) 27 and 28 and an instrumentation amplifier (INS) 29.

The peak-hold circuit 27 detects and holds a peak potential appearing at the terminal 22c of the bridge circuit 22. The peak-hold circuit 28 detects and holds a peak potential appearing at the terminal 22d of the bridge circuit 22. The instrumentation amplifier 28 amplifies the potential difference between the peak potential held by the peak-hold circuit 27 and the peak potential held by the peak-hold circuit 28, and outputs a resulting signal SG2.

On the other hand, the detection unit 30 is equipped with an amplifier (AMP) 31, a switch circuit (SW) 32, an amplitude detection circuit 33, a phase detection circuit 34, a microcomputer 35, the switch circuit 36, and an amplifier 37.

The amplitude detection circuit 33 is equipped with a lowpass filter (LPF) 33a, an analog switch 33c, and a peak-hold circuit 33d. The phase detection circuit 34 is equipped with a differentiation circuit 34a, an amplifier 34b, a differentiation circuit 34c, and a comparator (COMP) 34d.

The microcomputer 35 performs various controls for realizing the function of the magnetic field detection sensor 200 by running programs that are incorporated therein in advance. For example, the microcomputer 35 recognizes the strength and direction of an external magnetic field detected on the basis of an amplitude detection signal SG9 that is output from the amplitude detection circuit 33 and a phase difference detection signal SG5 that is output from the phase detection circuit 34, and outputs the recognized information as a digital output signal SG10. The microcomputer 35 also outputs an AC bias waveform output signal SG11 which is a triangular wave and an AC bias waveform output signal SG12 which is a sinusoidal wave.

The AC bias waveform output signal SG11 or SG12 is supplied to the drive unit 20 (i.e., supplied to the bias coils 14A and 14B as an AC bias signal SG3) via the switch circuit 36 and the amplifier 37.

Figure 2:
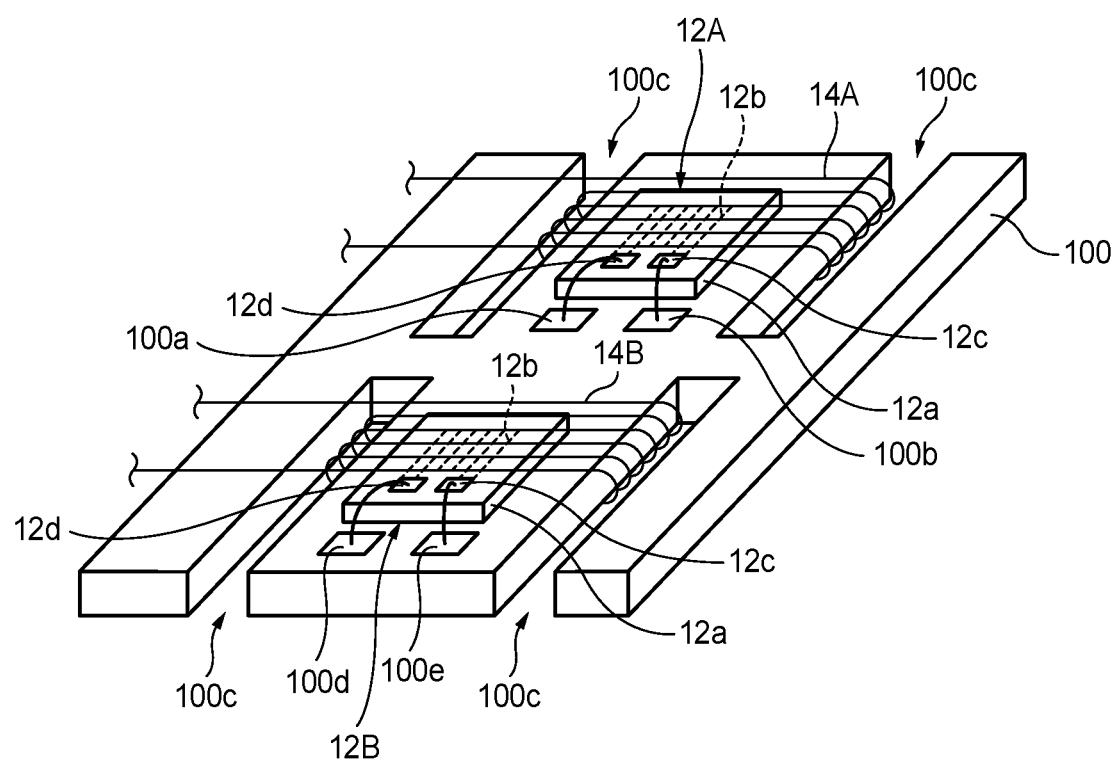
FIG. 2 is a perspective view showing example configurations of two (kinds of) magnetoimpedance elements.

Next, example configurations of the magnetoimpedance elements 12A and 12B will be described. FIG. 2 shows example configurations of the magnetoimpedance elements 12A and 12B. In the example shown in FIG. 2, each of the magnetoimpedance elements 12A and 12B is composed of a non-magnetic substrate 12a, a magnetic thin-film (magnetic film) 12b, and electrodes 12c and 12d. The magnetoimpedance elements 12A and 12B are mounted on a common printed board 100 so as to be arranged adjacent to each other.

The non-magnetic substrate 12a, which is a substrate made of a non-magnetic material, is mounted on the printed board 100. The non-magnetic substrate 12a is made of calcium titanate, oxide glass, titania, alumina, or the like and, in the embodiment, is approximately shaped like a cuboid.

The magnetic thin-film 12b, which is a high-permeability metal magnetic film, is, as shown in FIG. 2, formed on the surface, opposite to the surface in contact with the printed board 100, of the non-magnetic substrate 12a in a meander form in a plan view. More specifically, the magnetic thin-film 12b extends so as to assume a rectangular-wave shape whose rising directions and falling directions extend in the longitudinal direction of the non-magnetic substrate 12a which is approximately shaped like a cuboid.

The magnetic thin-film 12b is given such magnetic anisotropy that its easy magnetization axis extends in its longitudinal direction in the film plane, and its easy magnetization axis extends, as a whole, in the longitudinal direction of the non-magnetic substrate 12a.

The electrodes 12c and 12d are formed on the surface of the non-magnetic substrate 12a at the two respective ends of the magnetic thin-film 12b, and connected, by bonding wires, to electrodes 100a and 100b or 100d and 100e which are formed on the printed board 100. In the embodiment, to connect the two magnetoimpedance elements 12A and 12B in series, the electrodes 100b and 100d are electrically connected to each other by a circuit pattern (not shown) formed on the printed board 100. The electrodes 100a and 100e formed on the printed board 100 are connected to the respective terminals 22a and 22c of the bridge circuit 22 shown in FIG. 1.

As shown in FIG. 2, cuts 100c are formed in the printed board 100 on the two respective sides, in its width direction, of each of the magnetoimpedance elements 12A and 12B so as to be spaced from the magnetoimpedance element 12A or 12B. Each cut 100c extends from an edge of the printed board 100 to close to its center line.

The bias coil 14A is wound around the magnetoimpedance element 12A through the associated cuts 100c of the printed board 100, and the bias coil 14B is wound around the magnetoimpedance element 12B through the associated cuts 100c of the printed board 100.

Figure 3:
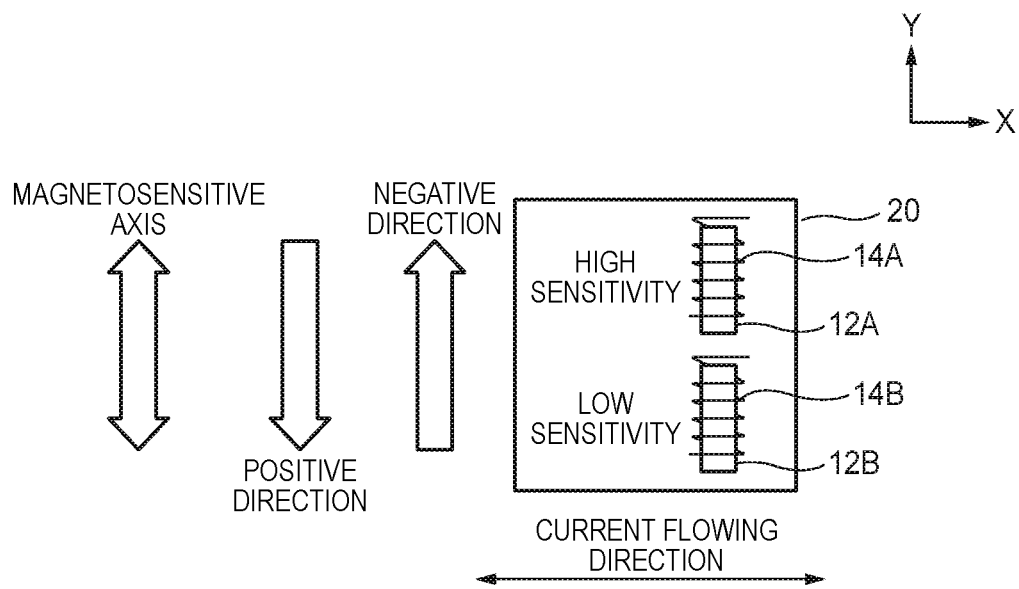
FIG. 3 is a plan view showing an example manner of arrangement of the two kinds of magnetoimpedance elements and a relationship between their magnetosensitive axes and an external magnetic field.

FIG. 3 shows an example manner of arrangement of the two magnetoimpedance elements 12A and 12B shown in FIG. 2 and a relationship between their magnetosensitive axes and an external magnetic field. As shown in FIG. 3, the coil axes of the bias coils 14A and 14B are parallel with the longitudinal directions of the non-magnetic substrates 12a, respectively, and the longitudinal directions of the magnetoimpedance elements 12A and 12B are parallel with a magnetic field detecting direction. Since as mentioned above the longitudinal directions of the non-magnetic substrates 12a are set parallel with the easy magnetization axes, the magnetic thin-films 12b are given such magnetic anisotropy that their easy magnetization axes are parallel with the magnetic field detecting direction.

Although not shown in any drawings, the magnetic thin-films 12b may be formed on the back surfaces of the non-magnetic substrates 12a, that is, on the surfaces that are in contact with the printed board 100. In this case, each pair of electrodes 12c and 12d are formed on the back surface of the non-magnetic substrate 12a at the two respective ends of the magnetic thin-film 12b. The electrodes 100a, 100b, 100d, and 100e which are formed on the printed board 100 are also provided on the side of the back surfaces of the non-magnetic substrates 12a.

Although in the example configuration shown in FIGS. 2 and 3 the two magnetoimpedance elements 12A and 12B are arranged in the longitudinal direction of the printed board 100, they may be arranged in the shorter-axis direction of the printed board 100. Furthermore, the two magnetoimpedance elements 12A and 12B may be arranged so as to be replaced with each other in the longitudinal direction or the shorter-axis direction of the printed board 100.

<Magnetism Detection Characteristics of Magnetoimpedance Elements 12A and 12B>

Figure 4:
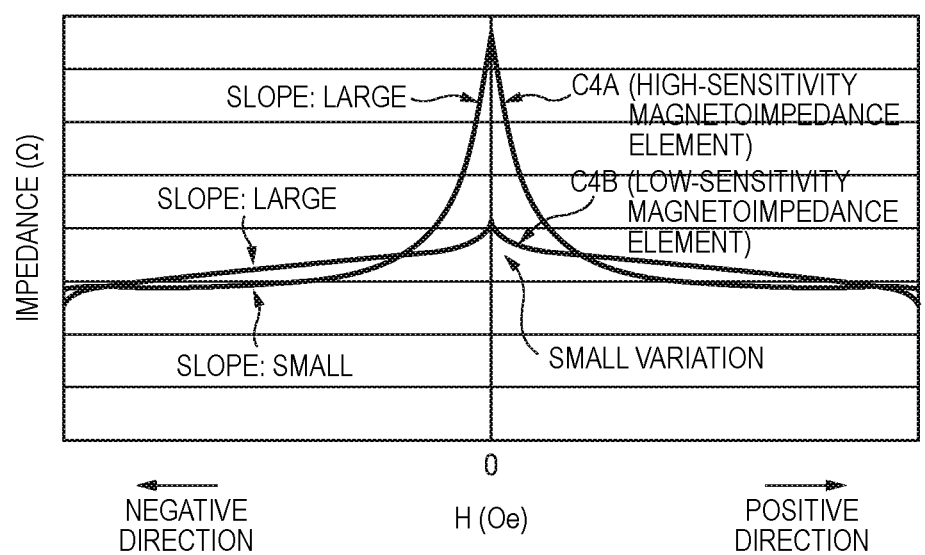
FIG. 4 is a graph showing specific example magnetism detection characteristics of the two kinds of magnetoimpedance elements which are different from each other in the sensitivity to an external magnetic field.

FIG. 4 shows specific example magnetism detection characteristics C4A and C4B of the two magnetoimpedance elements 12A and 12B. In FIG. 4, the horizontal axis represents the strength and direction of an external magnetic field H (Oe) and the vertical axis represents the impedance (DC resistance) ($\Omega$) between the two ends of each magnetic thin-film 12b.

As shown in FIG. 4, the impedance of each of the magnetoimpedance elements 12A and 12B has a maximum value when the strength of the external magnetic field is equal to zero and decreases in proportion to the strength of the external magnetic field as the external magnetic field becomes stronger in the positive or negative direction. Thus, the impedance curve of each of the magnetoimpedance elements 12A and 12B assumes a pyramid-like shape. As such, the characteristic of each of the magnetoimpedance elements 12A and 12B is much different from the M-shaped characteristic of the common magnetoimpedance elements disclosed in Patent documents JP-A-9-127218 and JP-A-2000-180521.

Since the magnetoimpedance elements 12A and 12B having such a pyramid-shaped characteristic are employed, the slope of an impedance variation with respect to a variation of the external magnetic field H is sufficiently large as shown in FIG. 4 even if the impedance is around the maximum value (in this case, the peak value). Thus, an external magnetic field can be detected with high sensitivity without the need for shifting the operating point to a position that is deviated from the reference point and it is not necessary to cause large bias currents to flow.

However, as shown in FIG. 4, the magnetism detection characteristic C4A of the high-sensitivity magnetoimpedance element 12A has a tendency that whereas a large impedance variation occurs in a relatively narrow range of the external magnetic field H that is close to zero, the slope of an impedance variation decreases as the external magnetic field H becomes stronger. As a result, where the magnetoimpedance element 12A is used singly, it is difficult to detect the strength of a magnetic field correctly in a range where it is strong.

On the other hand, in the magnetism detection characteristic C4B of the low-sensitivity magnetoimpedance element 12B, because of its low sensitivity, a sufficiently large impedance variation does not occur in a relatively narrow range where the external magnetic field H is close to zero. Thus, it is difficult to detect the strength of a magnetic field correctly in this range. On the other hand, in a range where the external magnetic field H is relatively strong, the magnetism detection characteristic C4B of the low-sensitivity magnetoimpedance element 12B produces a larger impedance variation than the magnetism detection characteristic C4A of the high-sensitivity magnetoimpedance element 12A does.

Hence, the magnetic field detection sensor 200 shown in FIG. 1 which employs the combination of the two (i.e., high-sensitivity and low-sensitivity) magnetoimpedance elements 12A and 12B which are connected to each other in series is given the advantages of both kinds of magnetism detection characteristics C4A and C4B. That is, since the impedance of the overall series circuit of the magnetoimpedance elements 12A and 12B is equal to the sum of the resistances of the two magnetism detection characteristics C4A and C4B shown in FIG. 4, the output reflects impedance variations of the two magnetism detection characteristics C4A and C4B.

As a result, in a relatively narrow range where the external magnetic field H is close to zero, the overall series circuit exhibits a large impedance variation due to the magnetism detection characteristic C4A. In a range where the external magnetic field H is relatively strong and the magnetoimpedance element 12A exhibits a small impedance variation, the overall series circuit exhibits a large impedance variation due to the magnetism detection characteristic C4B. In this manner, the external magnetic field H can be detected correctly in both of a range where it is weak and a range where it is strong.

Although in the bridge circuit 22 shown in FIG. 1 the two magnetoimpedance elements 12A and 12B are connected to each other in series, they can be used in a similar manner even if they are connected to each other in parallel. The number of or the number of types of magnetoimpedance elements that are connected to each other in series or in parallel may be made larger than in the embodiment.

<Signal Output Characteristic of Bridge Circuit 22>

Figure 5A:
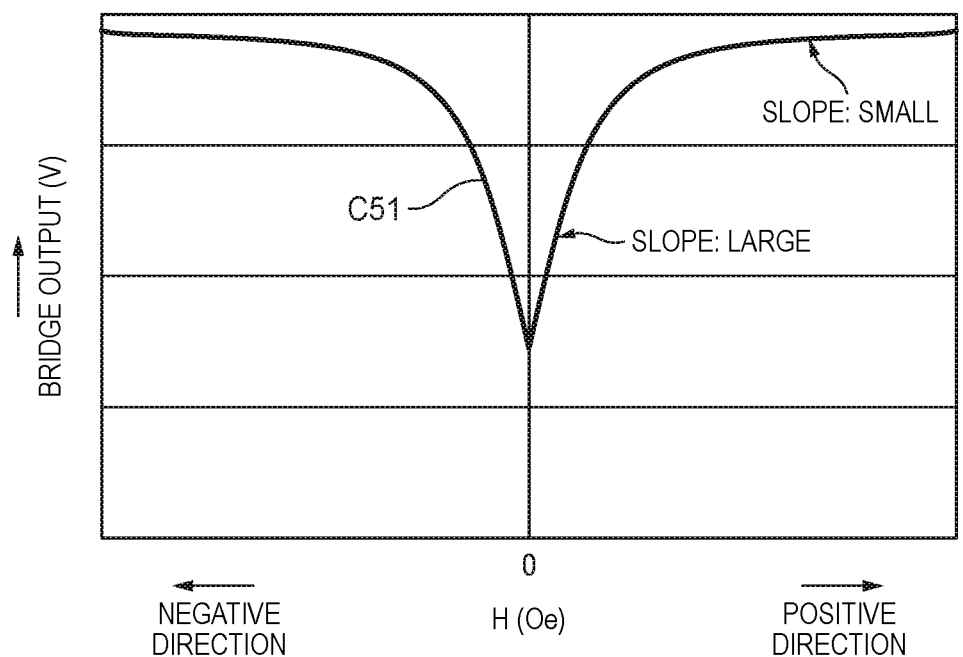
FIG. 5A is a graph showing a signal output characteristic of a bridge circuit that uses only the high-sensitivity magnetoimpedance element.
Figure 5B:
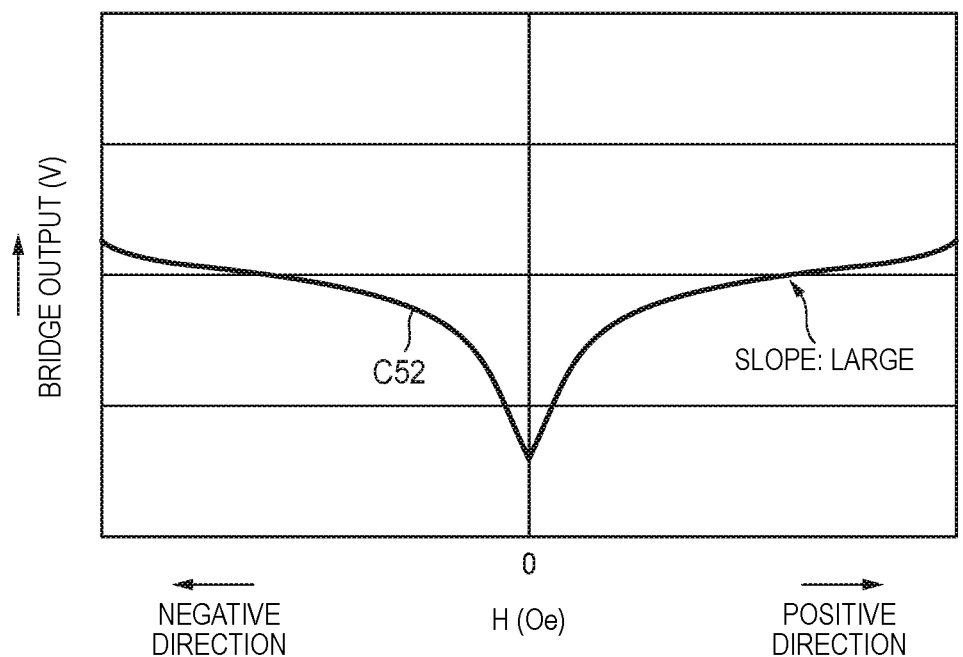
FIG. 5B is a graph showing a signal output characteristic of a bridge circuit that uses the two kinds of (i.e., high-sensitivity and low-sensitivity) magnetoimpedance elements.

FIG. 5A shows a signal output characteristic C51 of a bridge circuit that uses only the high-sensitivity magnetoimpedance element 12A. FIG. 5B shows a signal output characteristic C52 of the bridge circuit 22 which uses the two kinds of (i.e., high-sensitivity and low-sensitivity) magnetoimpedance elements 12A and 12B. That is, FIG. 5A shows the signal output characteristic C51 of the case that in the bridge circuit 22 shown in FIG. 1 only the high-sensitivity magnetoimpedance element 12A is used instead of the series circuit of the magnetoimpedance elements 12A and 12B. FIG. 5B shows a signal output characteristic C52 of the bridge circuit 22 shown in FIG. 1 which uses the series circuit of the magnetoimpedance elements 12A and 12B.

In each of the graphs shown in FIGS. 5A and 5B, the horizontal axis represents the strength and direction of an external magnetic field H (Oe) and the vertical axis represents the output voltage (V) of the bridge circuit (22). In the signal output characteristic C51 shown in FIG. 5A, as in the magnetism detection characteristic C4A shown in FIG. 4, the slope of an output voltage variation is large in a range where the external magnetic field is weak but is small in a range where the external magnetic field is strong. That is, where only the magnetoimpedance element 12A is used, detection is difficult in a range where the external magnetic field is strong. Thus, it cannot be said that a detectable external magnetic field range is sufficiently wide.

On the other hand, in the signal output characteristic C52 shown in FIG. 5B, since it reflects both of the two kinds of magnetism detection characteristics C4A and C4B, the slope of an output voltage variation is relatively large over a wide range that includes a range where the external magnetic field is weak and a range the external magnetic field is strong. Thus, even without sensor switching or the like, a magnetic field can be detected continuously in a wide range from a weak magnetic field to a strong magnetic field.

Figure 6A:
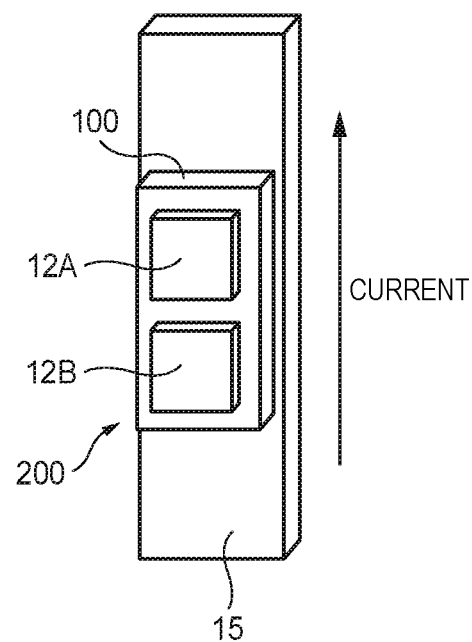
FIG. 6A is a perspective view showing an example configuration of a vehicular current sensor that employs the magnetic field detection sensor shown in FIG. 1.

Next, an example configuration for detection of a current will be described. FIG. 6A shows an example configuration of a vehicular current sensor that employs the magnetic field detection sensor 200 shown in FIG. 1, and FIG. 6B shows its structure in a cross section taken by a plane including the thickness direction.

Figure 6B:
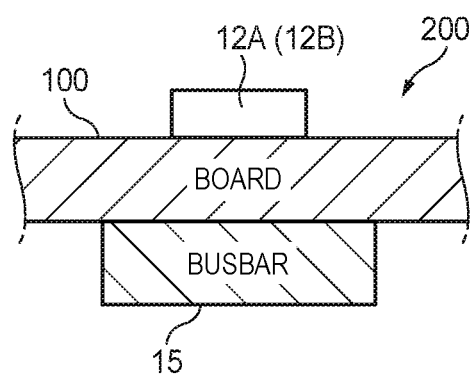
FIG. 6B shows a structure of the current sensor of FIG. 6A in a cross section taken by a plane including the thickness direction.

The magnetic field detection sensor 200 shown in FIGS. 6A and 6B can be used for measuring a DC current flowing through a busbar 15 that is disposed in a vehicle power system, for example. A very large current of 100 (A) or more or a relatively small current may flow through the busbar 15 depending on a situation. This requires a current sensor capable of measuring a target current in a wide range with high accuracy.

In the example shown in FIGS. 6A and 6B, the printed board 100 of the magnetic field detection sensor 200 is placed on a flat surface of the busbar 15. As in the configuration shown in FIG. 2, this magnetic field detection sensor 200 has the two magnetoimpedance elements 12A and 12B which are arranged adjacent to each other on the printed board 100. The two magnetoimpedance elements 12A and 12B are electrically insulated from the busbar 15 by the printed board 100.

When a DC current flows through the busbar 15 as shown in FIG. 6A, a magnetic field is generated according to the magnitude and the direction of the current. The magnetic field detection sensor 200 shown in FIGS. 6A and 6B can detect the strength and direction of the magnetic field generated by the current flowing through the busbar 15. As a result, the magnetic field detection sensor 200 can detect the current flowing through the busbar 15.

<Basic Principle of Operation with use of Magnetoimpedance Elements 12A and 12B>

Figure 7:
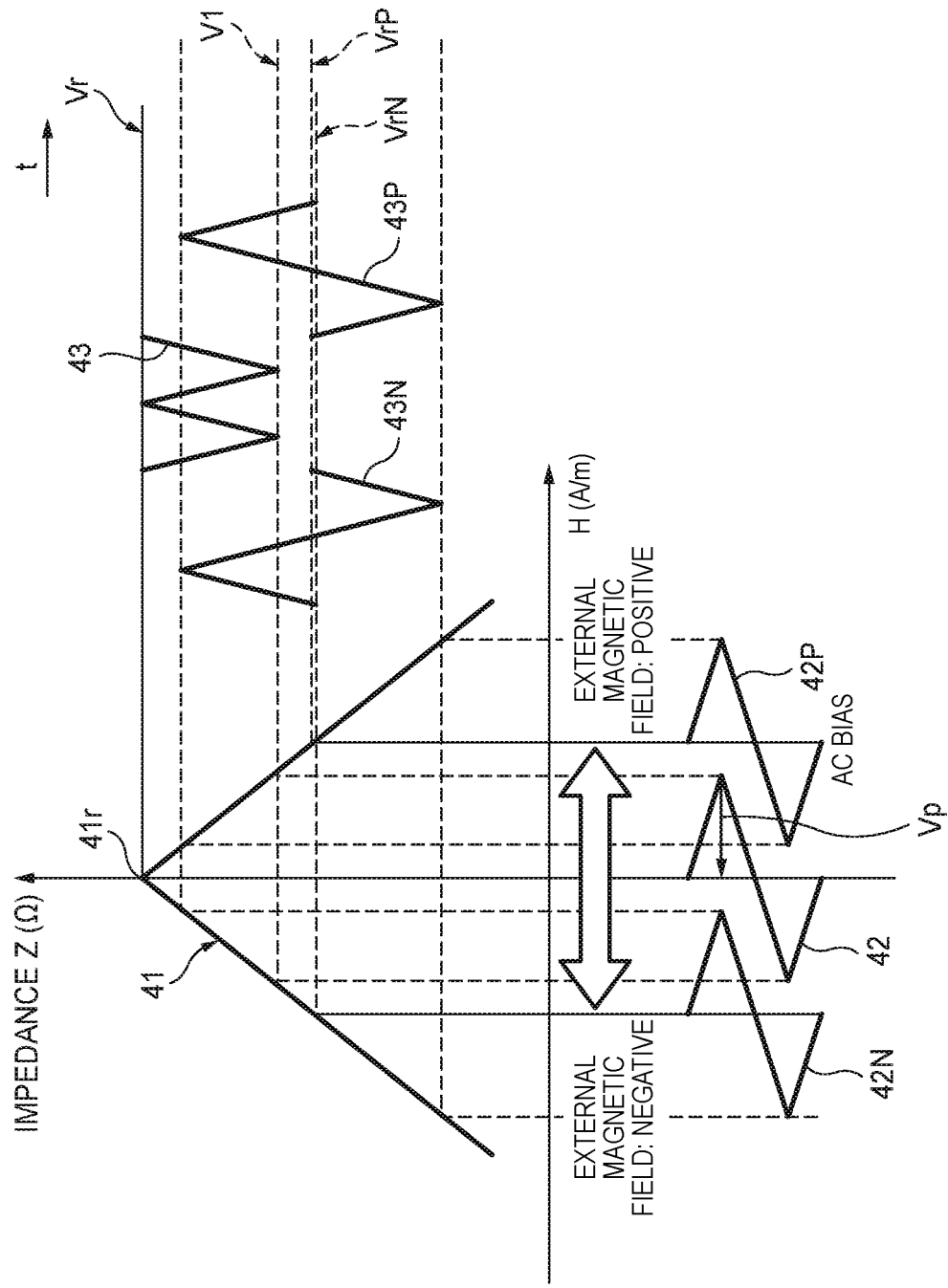
FIG. 7 is a graph showing an example correlation between an input magnetic field and an output signal of the series circuit of the two magnetoimpedance elements.

FIG. 7 shows an example correlation between an input magnetic field and an output signal of the series circuit of the magnetoimpedance elements 12A and 12B of the bridge circuit 22. In the graph of an impedance characteristic 41 shown in FIG. 7, the horizontal axis represents the strength and direction of an external magnetic field H (A/m) applied to the magnetoimpedance elements 12A and 12B and the vertical axis represents the impedance Z (DC resistance) (Ω) between the terminals 12Aa and 12Bb of the series circuit of the magnetoimpedance elements 12A and 12B.

As shown in FIG. 7, an AC bias magnetic field 42 is applied to the magnetic thin-films 12b by currents flowing through the bias coils 14A and 14B so that the magnetoimpedance elements 12A and 12B operate with a reference point 41r of the impedance characteristic 41 as the center. The example of FIG. 7 assumes a case that a triangular-wave AC bias magnetic field 42 having an amplitude Vp is applied. Thus, the AC bias magnetic field 42 varies with the amplitude Vp with the reference point 41r as the center so as to become positive and negative alternately.

An external magnetic field as a detection target is applied to the magnetic thin-films 12b in addition to the AC bias magnetic field 42. Thus, as shown in FIG. 7, the sum 42P or 42N of the external magnetic field and the AC bias magnetic field 42 is applied to the magnetic thin-films 12b. When the external magnetic field is positive, the sum 42P of the external magnetic field and AC bias magnetic field 42, that is, a waveform obtained by shifting the waveform of the AC bias magnetic field 42 to the positive side by the absolute value of the external magnetic field is applied to the magnetic thin-films 12b. When the external magnetic field is negative, the sum 42N of the external magnetic field and AC bias magnetic field 42, that is, a waveform obtained by shifting the waveform of the AC bias magnetic field 42 to the negative side by the absolute value of the external magnetic field is applied to the magnetic thin-films 12b.

The impedance Z varies according to the impedance characteristic 41 and the magnetic field applied to the magnetic thin-films 12b, that is, the sum 42P or 42N of the external magnetic field and the AC bias magnetic field 42. The variation of the impedance Z can be taken out as a sensor output signal 43, 43P, or 43N using the bridge circuit 22 etc. shown in FIG. 1.

In FIG. 7, the sensor output signals 43, 43P, and 43N correspond to the AC bias magnetic field 42 and the sums 42P and 42N of the external magnetic field and the AC bias magnetic field 42, respectively. That is, the sensor output signal 43, 43P, or 43N is determined by the variation of the AC bias magnetic field 42 and the external magnetic field. In each of the sensor output signals 43, 43P, and 43N shown in FIG. 7, the vertical axis represents the potential (amplitude) of the signal and the horizontal axis represents time.

When the external magnetic field is equal to zero, the sensor output signal 43 is output that varies according to a variation of the AC bias magnetic field 42 between a potential Vr corresponding to a resistance of the reference point 41r and a potential V1 that is deviated from the potential Vr by a voltage corresponding to the amplitude Vp.

When a positive external magnetic field is applied, the sensor output signal 43P is obtained that varies as the AC bias magnetic field 42 varies between potentials that are deviated to the upper side and the lower side from a center potential VrP that is shifted from the potential Vr of the reference point 41r by the absolute value of the external magnetic field. When a negative external magnetic field is applied, the sensor output signal 43N is obtained that varies as the AC bias magnetic field 42 varies between potentials that are deviated to the upper side and the lower side from a center potential VrN that is shifted from the potential Vr of the reference point 41r by the absolute value of the external magnetic field.

As shown in FIG. 7, the sensor output signal 43, 43P, or 43N has features that reflect the strength and direction of the external magnetic field. Thus, it is possible to determine the strength and direction of the external magnetic field on the basis of the sensor output signal 43, 43P, or 43N.

<Example Behaviors of Principal Signals in Magnetic Field Detection Sensor 200>

Figure 8:
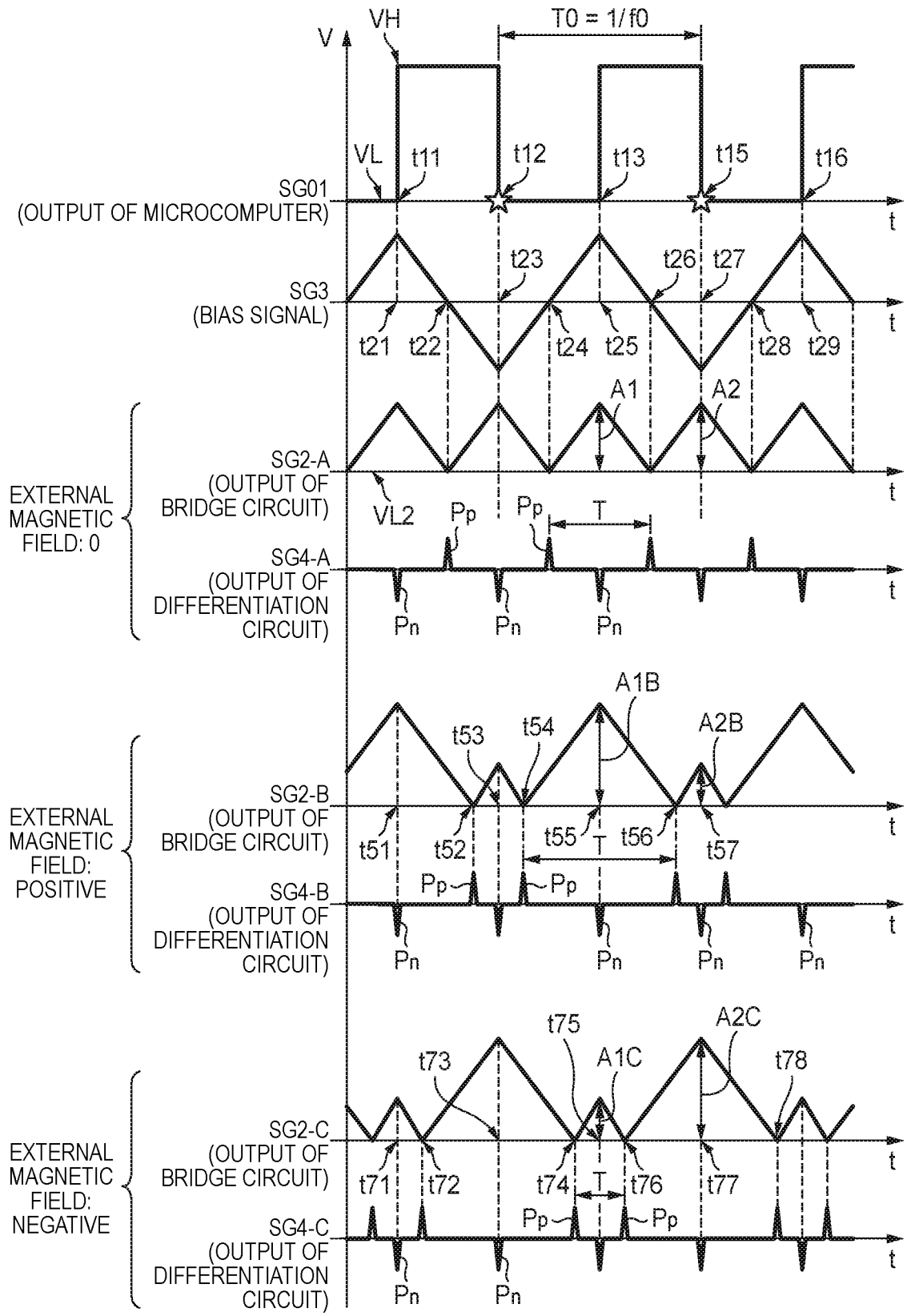
FIG. 8 is a time chart showing an example of how principal signals in the magnetic field detection sensor vary.

FIG. 8 shows an example of how principal signals in the magnetic field detection sensor 200 vary. In FIG. 8, the horizontal axes of the charts of the signals represent the common time t and the vertical axes represent the potential.

As shown in FIG. 8, where a triangular-wave bias signal SG3 is to be applied to the bias coils 14A and 14B, the bias signal SG3 is generated on the basis of an AC bias waveform signal SG11 that is output from the microcomputer 35.

For example, when a signal SG01 rises from a low potential VL to a high potential VH at time t11, the potential of the bias signal SG3 starts to decrease at a constant slope and continues to decrease in this manner until the signal SG01 falls from the high potential VH to the low potential VL at time t12. The potential of the bias signal SG3 starts, at time t12, to increase at a constant slope and continues to increase in this manner until the signal SG01 rises from the low potential VL to the high potential VH at time t13. A triangular wave is generated by repetition of this operation.

Signals SG2-A, SG2-B, and SG2-C shown in FIG. 8 correspond to an output of the bridge circuit 22, for example, a signal SG2 that is output from the signal processing unit 23 shown in FIG. 1. Signals SG4-A, SG4-B, and SG4-C correspond to an output of a differentiation circuit, for example, a signal SG4 that is output from the differentiation circuit 34c shown in FIG. 1. The signals SG2-A and SG4-A correspond to an external magnetic field being equal to zero, the signals SG2-B and SG4-B correspond to a positive external magnetic field, and the signals SG2-C and SG4-C correspond to a negative external magnetic field.

The signal SG2-A shown in FIG. 8 varies in the same manner as the sensor output signal 43 shown in FIG. 7. More specifically, the signal SG2-A takes a low potential VL2 corresponding to the reference point 41r at time points t22, t24, ... when the bias signal SG3 becomes equal to zero. In the other periods, the signal SG2-A varies so as to be higher than the low potential VL2 according to a potential variation of the bias signal SG3. Thus, the signal SG2-A is a triangular wave whose cycle is a half of the cycle of the bias signal SG3.

<Case of External Magnetic Field Being Zero>

In the waveform of the signal SG2-A, amplitudes A1 and A2 are the same. The amplitude A1 occurs at peak time points t21, t25, t29 ... when the bias signal SG3 makes an increase-to-decrease turn. And the amplitude A2 occurs at peak time points t23, t27, ... when the bias signal SG3 makes a decrease-to-increase turn.

On the other hand, in the waveform of the signal SG4-A shown in FIG. 8, negative short pulses Pn appear at peak time points t21, t23, t25, ... when the signal SG2-A makes an increase-to-decrease turn. And positive short pulses Pp appear at peak time points t22, t24, t26, ... when the signal SG2-A makes a decrease-to-increase turn.

In the waveform of the signal SG4-A, the interval (cycle) between two adjacent positive pulses Pp is a half of one cycle T0 of the signal SG01 and is constant. The same is true of the negative pulses Pn. Where the frequency of the signal S91 is f0, its cycle T0 is equal to the inverse of the frequency f0 (T0=1/f0).

<Case of Application of Positive External Magnetic Field>

In the waveform of the signal SG2-B, amplitudes A1B and A2B are different from each other. The amplitude A1B occurs at a peak time point t55 when the bias signal SG3 makes an increase-to-decrease turn in one cycle T0 of the signal SG01. And the amplitude A2B occurs at a peak time point t57 when the bias signal SG3 makes a decrease-to-increase turn.

Since the signal SG2-B is influenced by the positive external magnetic field being applied to the magnetic thin-films 12b, the amplitude A1B is larger than the above-described amplitude A1 with no external magnetic field and the amplitude A2B is smaller than the above-described amplitude A2 with no external magnetic field. Since the amplitudes A1B and A2B reflect the strength and direction of the external magnetic field, the strength and direction of the external magnetic field can be calculated using at least one of the amplitudes A1B and A2B.

On the other hand, in the waveform of the signal SG4-B shown in FIG. 8, negative short pulses Pn appear at peak time points t51, t53, t55, . . . when the signal SG2-B makes an increase-to-decrease turn. And positive short pulses Pp appear at peak time points t52, t54, t56, . . . when the signal SG2-B makes a decrease-to-increase turn.

In the waveform of the signal SG4-B, the positive pulses Pp are deviated in timing from those of the signal SG4-A. That is, the phases of (the timing between) the pulses Pp and Pn reflect the external magnetic field. For example, the interval T from time t54 when the potential of the signal SG2-B starts to increase (a pulse Pp is formed) to time t56 when the potential of the signal SG2-B starts to increase next time (a pulse Pp is formed) is longer than the corresponding interval (cycle) T of the signal SG4-A.

That is, the interval T between the positive pulses Pp reflects phase differences of the pulses Pp induced by the external magnetic field. Thus, the strength and direction of the external magnetic field can be calculated by detecting the phase differences of or the interval T between the pulses Pp.

<Case of Application of Negative External Magnetic Field>

In the waveform of the signal SG2-C, amplitudes A1C and A2C are different from each other. The amplitude A1C occurs at a peak time point t75 when the bias signal SG3 makes an increase-to-decrease turn in one cycle T0 of the signal SG01. And the amplitude A2C occurs at a peak time point t77 when the bias signal SG3 makes a decrease-to-increase turn.

Since the signal SG2-C is influenced by the negative external magnetic field being applied to the magnetic thin-films 12b, the amplitude A1C is smaller than the above-described amplitude A1 with no external magnetic field and the amplitude A2C is larger than the above-described amplitude A2 with no external magnetic field. Since the amplitudes A1C and A2C reflect the strength and direction of the external magnetic field, the strength and direction of the external magnetic field can be calculated using at least one of the amplitudes A1C and A2C.

On the other hand, in the waveform of the signal SG4-C shown in FIG. 8, negative short pulses Pn appear at peak time points t71, t73, t75, . . . when the signal SG2-C makes an increase-to-decrease turn. And positive short pulses Pp appear at peak time points t72, t74, t76, . . . when the signal SG2-C makes a decrease-to-increase turn.

In the waveform of the signal SG4-C, the positive pulses Pp are deviated in timing from those of the signal SG4-A. That is, the phases of (the timing between) the pulses Pp and Pn reflect the external magnetic field. For example, the interval T from time t74 when the potential of the signal SG2-C starts to increase (a pulse Pp is formed) to time t76 when the potential of the signal SG2-C starts to increase next time (a pulse Pp is formed) is shorter than the corresponding interval (cycle) of the signal SG4-A.

That is, the interval T between the positive pulses Pp reflects the phase differences of the pulses Pp induced by the external magnetic field. Thus, the strength and direction of the external magnetic field can be calculated by detecting the phase differences of or the interval T between the pulses Pp.

<Example Behaviors of Principal Signals in a Case of Strong External Magnetic Field>

Figure 9:
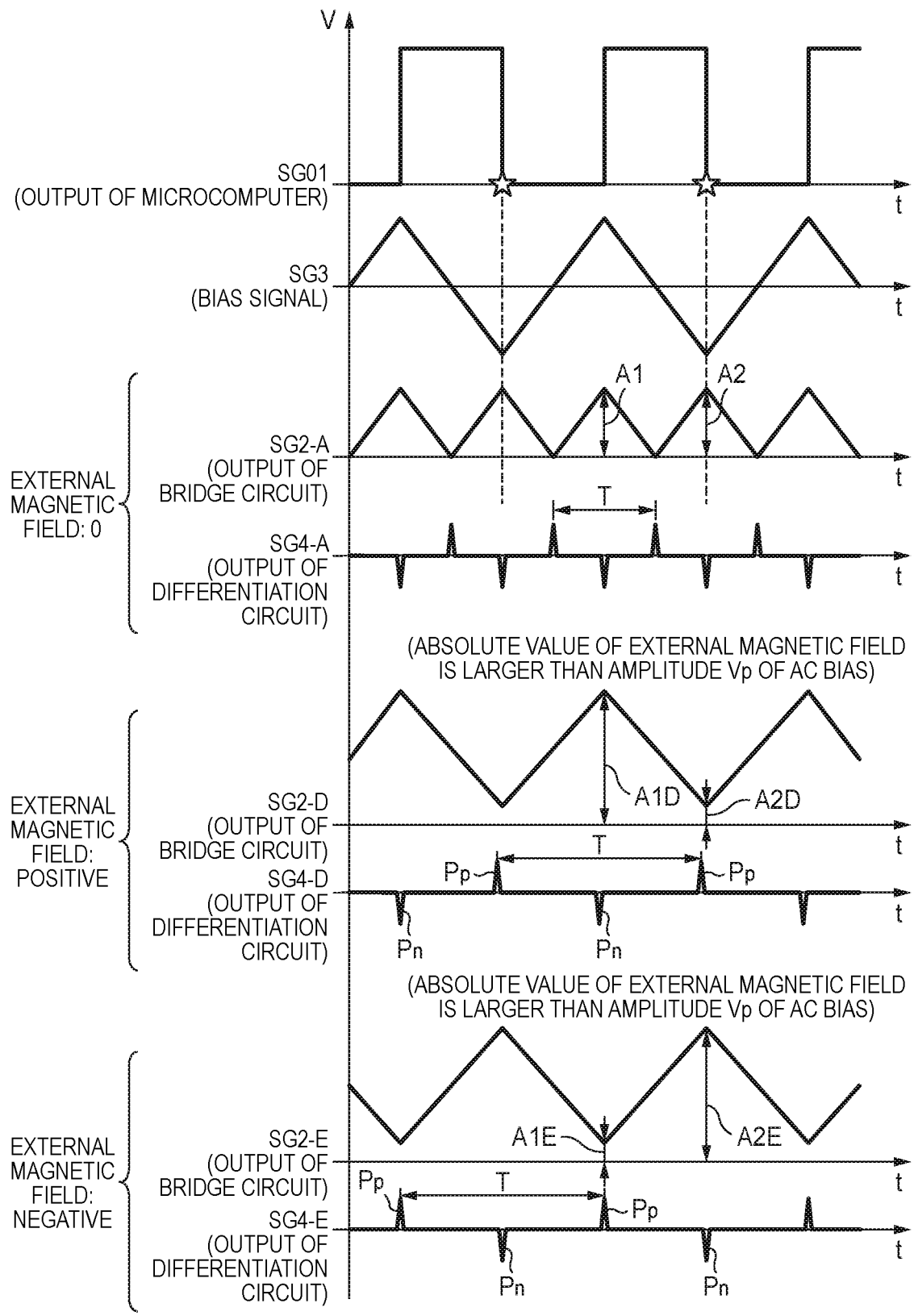
FIG. 9 is a time chart showing an example of how principal signals vary in the case of a strong external magnetic field.

FIG. 9 shows an example of how principal signals vary in the case of a strong external magnetic field. In FIG. 9, the horizontal axes of the charts of the signals represent the common time t and the vertical axes represent the potential.

The signals SG01, SG3, SG2-A, and SG4-A shown in FIG. 9 are the same as shown in FIG. 8.

Signals SG2-A, SG2-D, and SG2-E shown in FIG. 9 correspond to an output of the bridge circuit 22, for example, a signal SG2 that is output from the signal processing unit 23 shown in FIG. 1. Signals SG4-A, SG4-D, and SG4-E correspond to an output of a differentiation circuit, for example, a signal SG4 that is output from the differentiation circuit 34c shown in FIG. 1.

The signals SG2-A and SG4-A correspond to an external magnetic field being equal to zero. The signals SG2-D and SG4-D correspond to a positive external magnetic field whose absolute value is larger than the amplitude Vp of the AC bias, and the signals SG2-E and SG4-E correspond to a negative external magnetic field whose absolute value is larger than the amplitude Vp of the AC bias.

In the example shown in FIG. 9, since the absolute value of the external magnetic field is larger than the amplitude Vp of the AC bias, the signals SG2-D and SG2-E are approximately the same in waveform as the bias signal SG3. Thus, the phase of a positive pulse Pp appearing in the signal SG4-D is constant and the interval T between two adjacent pulses Pp is also constant. Likewise, the phase of a positive pulse Pp appearing in the signal SG4-E is constant and the interval T between two adjacent pulses Pp is also constant.

Thus, in the situation shown in FIG. 9, the external magnetic field cannot be detected from the phases or intervals of the pulses Pp of the signal SG4-D or SG4-E. A phase variation of the pulses Pp can be detected as in the case of the signal SG4-B or SG4-C only when the absolute value of the external magnetic field is smaller than the amplitude Vp of the AC bias.

However, even in the situation of FIG. 9, since potentials A1D and A2D reflect the strength of the external magnetic field, the strength and direction of the external magnetic field can be calculated on the basis of at least one of the potentials A1D and A2D. Likewise, since potentials A1E and A2E reflect the strength of the external magnetic field, the strength and direction of the external magnetic field can be calculated on the basis of at least one of the potentials A1E and A2E.

<Operation of Detection Unit 30>

A signal SG2 that is output from the instrumentation amplifier 29 is supplied to the input of the amplifier 31 of the detection unit 30. When the external magnetic field is equal to zero, the signal SG2 is a triangular wave like the signal SG2-A shown in FIG. 8. In the case of a positive or negative external magnetic field, the signal SG2 has a waveform like the signal SG2-B or SG2-C shown in FIG. 8. When the absolute value of the external magnetic field is larger than the amplitude Vp of the bias signal, the signal SG2 has a waveform like the signal SG2-D or SG2-E shown in FIG. 9. The signal SG2 is amplified by the amplifier 31 and supplied selectively to the input of one of the amplitude detection circuit 33 and the phase detection circuit 34 through switching of the switch circuit 32.

<Operation of Amplitude Detection Circuit 33>

In the amplitude detection circuit 33, a signal having a waveform that is equivalent to the waveform of the signal SG2-A, SG2-B, or SG2-C shown in FIG. 8 is supplied to the input of the lowpass filter (LPF) 33a. The lowpass filter 33a performs an integration operation on the received signal and thereby eliminates high-frequency components. Thus, when receiving, for example, a triangular-wave signal, the lowpass filter 33a outputs a signal SG6 that is close to a sinusoidal wave.

The analog switch 33c is controlled by a binary signal that is generated from an AC bias waveform output signal SG11 or SG12 generated in the microcomputer 35. The signal SG6 which is output from the lowpass filter 33a is input to the peak-hold circuit 33d past the analog switch 33c.

The peak-hold circuit 33d can detect a peak potential of a signal SG7 that is output from the analog switch 33c and hold it. Thus, for example, the peak-hold circuit 33d can output, as an amplitude detection signal SG9, voltages corresponding to the amplitudes A1B and A2B of the signal SG2-B or the amplitudes A1C and A2C of the signal SG2-C shown in FIG. 8.

<Operation of Phase Detection Circuit 34>

In the phase detection circuit 34, a signal having a waveform that is equivalent to the waveform of the signal SG2-A, SG2-B, or SG2-C shown in FIG. 8 is supplied to the input of the differentiation circuit 34a from the output of the switch circuit 32. This input signal is differentiated by the differentiation circuit 34a, amplified by the amplifier 34b, and differentiated again by the differentiation circuit 34c, whereby the phase detection circuit 34 generates a signal SG4.

Thus, as in the signal SG4-B or SG4-C shown in FIG. 8, a negative pulse Pn is generated at each peak time point when the signal SG2-B or SG2-C makes an increase-to-decrease turn. And a positive pulse Pp is generated at each peak time point when the signal SG2-B or SG2-C makes a decrease-to-increase turn.

The comparator (COMP) 34d outputs, as a binary signal, a result of comparison between the output signal SG4 of the differentiation circuit 34c and a threshold value. This binary signal is a phase difference detection signal SG5 that represents the timing of generation of each positive pulse Pp correctly.

<Basic Operation of Microcomputer 35>

The microcomputer 35 can recognize, for example, one or both of the amplitudes A1B and A2B shown in FIG. 8 by measuring the voltage of the amplitude detection signal SG9 which is output from the amplitude detection circuit 33, and calculate the magnitude and direction of the external magnetic field on the basis of a measurement result. Furthermore, the microcomputer 35 can measure, for example, the interval T shown in FIG. 8 on the basis of the timing of the phase difference detection signal SG5 which is output from the phase detection circuit 34, and calculate the magnitude and direction of the external magnetic field on the basis of a measurement result.

<Relationship Between External Magnetic Field and Operation of Phase Detection Circuit 34>

Figure 10:
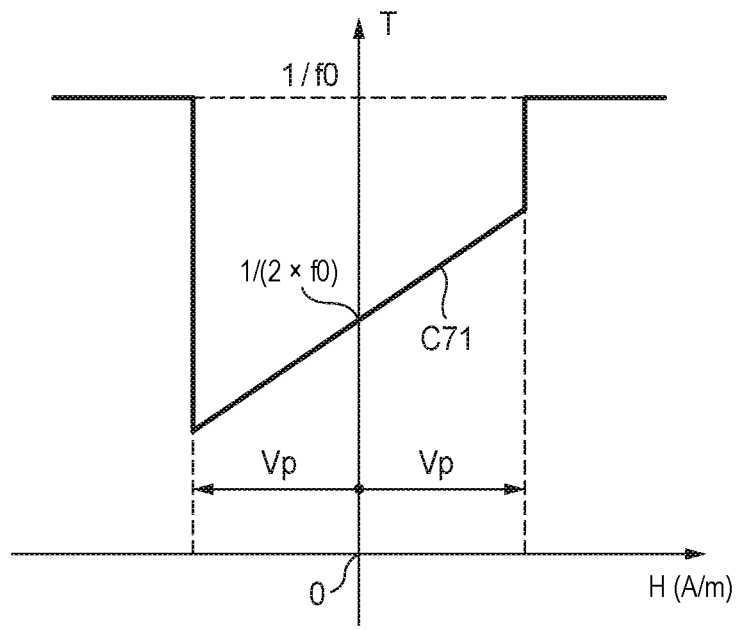
FIG. 10 is a graph showing an example relationship between the external magnetic field and the operation of a phase detection circuit.

FIG. 10 shows an example relationship between an external magnetic field and the operation of the phase detection circuit 34, that is, an example detection characteristic C71 of the phase detection circuit 34 of the detection unit 30. In FIG. 10, the horizontal axis represents the strength and direction of an external magnetic field H (A/m) and the vertical axis represents the interval T between positive pulses Pp (see FIG. 8 or 9) of the signal SG4 or SG5 in the phase detection circuit 34.

As shown in FIG. 10, according to the characteristic C71, an interval T that is equal to $1/(2 \times f0)$ is detected when the external magnetic field H is equal to zero. The frequency f0 is a fundamental frequency of the signal SG01. When the external magnetic field H is in a range of $-Vp<H<+Vp$, the detected interval T increases linearly in proportion to the absolute value of the external magnetic field H. Symbol Vp represents the amplitude of the AC bias magnetic field. When the value of the external magnetic field H is smaller than or equal to $-Vp$ or larger than or equal to $+Vp$, the detected interval T has a constant value $1/f0$.

That is, when the external magnetic field H is in the range of $-Vp<H<+Vp$, the microcomputer 35 can calculate the strength and direction of the external magnetic field H on the basis of an interval T of the phase difference signal SG5 which is output from the phase detection circuit 34 according to a calculation formula corresponding to the characteristic C71. As seen from the characteristic C71 shown in FIG. 10, the direction of the external magnetic field H can be judged positive if the detected interval T is longer than $1/(2 \times f0)$ and negative if the detected interval T is shorter than $1/(2 \times f0)$.

However, when the value of the external magnetic field H is smaller than or equal to $-Vp$ or larger than or equal to $+Vp$, the external magnetic field H cannot be calculated on the basis of a detected interval T. In view of this, when the value of the external magnetic field H is smaller than or equal to $-Vp$ or larger than or equal to $+Vp$, the microcomputer 35 calculates the strength and direction of the external magnetic field H utilizing the amplitude detection signal SG9 which is output from the amplitude detection circuit 33.

<Relationship Between External Magnetic Field and Amplitude Detected by Amplitude Detection Circuit 33>

Figure 11:
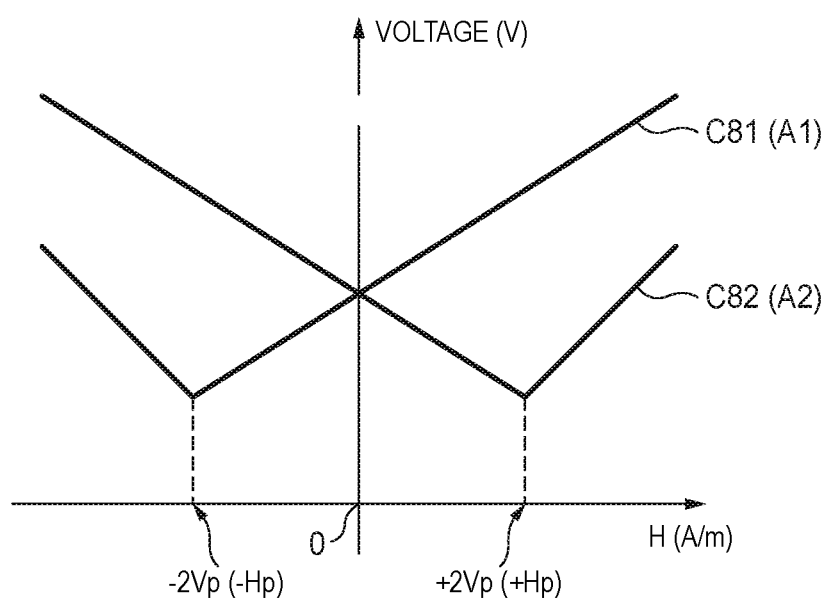
FIG. 11 is a graph showing example relationships between the external magnetic field and the amplitudes detected by an amplitude detection circuit.

FIG. 11 shows example relationships between the external magnetic field and the amplitudes detected by the amplitude detection circuit 33. Detection characteristics C81 and C82 of the amplitude detection circuit 33 shown in FIG. 11 correspond to the respective amplitudes A1 (strictly, A1B or A1C) and A2 (strictly, A2B or A2C) (see FIG. 8) of the amplitude detection signal SG9 which is output from the amplitude detection circuit 33.

The amplitude A1 is a voltage (V) of the signal SG2 at a rise of the signal SG01, and the amplitude A2 is a voltage (V) of the signal SG2 at a fall of the signal SG01. In FIG. 11, the horizontal axis represents the strength and direction of the external magnetic field H (A/m) and the vertical axis represents the voltage of the amplitude A1 or A2.

As seen from FIG. 11, in the case of the characteristic C81, the amplitude (voltage) A1 becomes smallest when the external magnetic field is equal to $-2 Vp$ and increases as the external magnetic field H increases away from this reference point.

In the case of the characteristic C82, the amplitude (voltage) A1 becomes smallest when the external magnetic field is equal to $+2 Vp$ and increases as the external magnetic field H increases away from this reference point.

Thus, the strength of the external magnetic field H can be calculated on the basis of, for example, information of at least one of the characteristics C81 and C82 shown in FIG. 11 and amplitudes (voltages) A1 and A2 of the amplitude detection signal SG9 which is output from the amplitude detection circuit 33. Since the characteristics C81 and C82 are different from each other, the direction (positive or negative) of the external magnetic field H can be determined by, for example, comparing the magnitudes of the amplitudes (voltages) A1 and A2.

<Relationship Between External Magnetic Field and Operation of Amplitude Detection Circuit 33>

Figure 12:
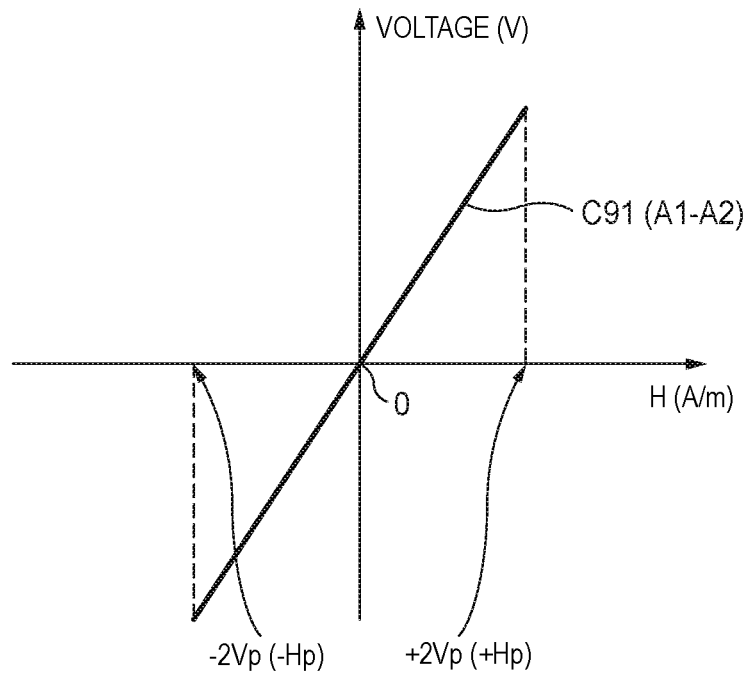
FIG. 12 is a graph showing an example relationship between the external magnetic field and the operation of the amplitude detection circuit.

FIG. 12 shows a relationship between the external magnetic field and the operation of the amplitude detection circuit 33, that is, a detection characteristic C91 of the amplitude detection circuit 33. More specifically, the characteristic C91 indicates a relationship between the external magnetic field H and the difference (A1−A2) between the amplitudes A1 (strictly, A1B or A1C) and A2 (strictly, A2B or A2C) shown in FIG. 8. In FIG. 12, the horizontal axis represents the strength and direction of an external magnetic field H (A/m) and the vertical axis represents the difference voltage (A1−A2) (V) between the amplitudes A1 and A2.

As shown in FIG. 12, according to the characteristic C91, the difference voltage (A1−A2) becomes equal to 0 when the external magnetic field H is equal to 0. In a positive range of the external magnetic field H, the difference voltage (A1−A2) is positive and increases in proportion to the external magnetic field H. In a negative range of the external magnetic field H, the difference voltage (A1−A2) is negative and its absolute value increases in proportion to the absolute value of the external magnetic field H.

The microcomputer 35 calculates a difference voltage (A1−A2) on the basis of a voltage of the amplification detection signal SG9 which is output from the amplitude detection circuit 33. And the microcomputer 35 can calculate the strength of the external magnetic field H on the basis of the difference voltage (A1−A2) according to the characteristic C91 shown in FIG. 12. The direction (positive or negative) of the external magnetic field H can be determined by recognizing whether the difference voltage (A1−A2) is positive or negative.

<Procedure of Characteristic Operation>

Figure 13:
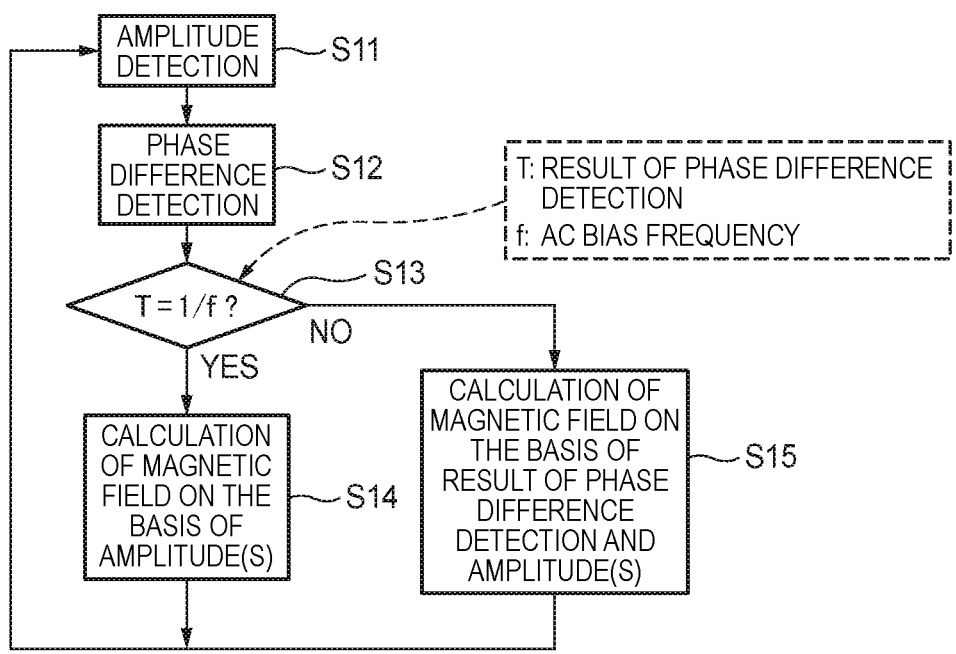
FIG. 13 is a flowchart showing the procedure of an operation characteristic of the magnetic field detection sensor.

FIG. 13 shows the procedure of an operation characteristic of the magnetic field detection sensor 200. An appropriate one of the amplitude detection circuit 33 and the phase detection circuit 34 can be used automatically according to a situation by executing the process shown in FIG. 13 by the microcomputer 35 of the magnetic field detection sensor 200.

At step S11, the microcomputer 35 acquires one or both of amplitudes A1 and A2 by inputting a signal corresponding to a signal SG2 to the amplitude detection circuit 33 through switching of the switch circuit 32 and measuring a voltage of an amplification detection signal SG9 which is output from the amplitude detection circuit 33.

At step S12, the microcomputer 35 inputs a signal corresponding to a signal SG2 to the phase detection circuit 34 through switching of the switch circuit 32 and measures an interval T on the basis of a phase detection signal SG5 which is output from the phase detection circuit 34.

At step S13, the microcomputer 35 compares the interval T obtained at step S12 through phase difference detection with an AC bias cycle T0 (=1/f). If the interval T is equal to the AC bias cycle T0, the process moves to step S14. If the interval T is not equal to the AC bias cycle T0, the process moves to step S15.

A situation that causes a transition to step S14 is that the absolute value of an external magnetic field He that is applied to the magnetoimpedance elements 12A and 12B is larger than or equal to the AC bias amplitude Vp and hence phase difference information that varies according to the external magnetic field He cannot be obtained as in the case of the signals SG4-D and SG4-E shown in FIG. 9.

Thus, at step S14, the microcomputer 35 calculates the strength and direction of the external magnetic field He using only the result (A1 and/or A2) of the amplitude detection (step S11).

On the other hand, a situation that causes a transition to step S15 is that the absolute value of an external magnetic field He that is applied to the magnetoimpedance elements 12A and 12B is smaller than the AC bias amplitude Vp and hence phase difference information that varies according to the external magnetic field He can be obtained as in the case of the signals SG4-B and SG4-C shown in FIG. 9.

Thus, at step S15, the microcomputer 35 calculates the strength and direction of the external magnetic field He using both of the result (A1 and/or A2) of the amplitude detection (step S11) and the result (T) of the phase difference detection (step S12).

At step S15, to, for example, obtain a more accurate detection result, one of the following operations (A), (B), and (C) can be selected, for example, by a selection manipulation of a user or automatically according to a situation:

(A) calculating the strength of the external magnetic field He using both of amplitude information and phase difference information;

(B) calculating the strength of the external magnetic field He using only phase difference information; and (C) calculating the strength of the external magnetic field He using only amplitude information.

Where the operation (A) is to be performed, final external magnetic field strength Ht may be calculated according to, for example, the following equation:

$$Ht=(Ha+Hp)/2$$

where

Ha: external magnetic field strength calculated on the basis of only amplitude information; and Hp: external magnetic field strength calculated on the basis of only phase difference information.

The above averaging makes it possible to obtain a more reliable detection result over a wide external magnetic field range. Furthermore, since the bridge circuit 22 uses the combination of the high-sensitivity magnetoimpedance element 12A and the low-sensitivity magnetoimpedance element 12B, sufficiently high detection accuracy can be obtained over a wide range because the slope of a voltage variation is large in a wide range as indicated by the signal output characteristic C52 shown in FIG. 5B. In addition, continuous detection is possible because it is not necessary to switch sensors using a switch or manually.

Although the bridge circuit 22 shown in FIG. 1 is a full bridge circuit, a half bridge circuit may be used instead. Although in the configuration of FIG. 1 the two bias coils 14A and 14B are connected to each other in parallel, they may be connected to each other in series.

Features of the magnetic field detection sensor 200 according to the embodiment of the invention will be summarized concisely below in the form of items [1] to [5]:

[1] A magnetic field detection sensor (200), comprising:

a magnetism detection device having magnetic members (magnetic thin-films 12b) exhibiting a magnetoimpedance effect and bias coils (14A, 14B) which apply bias magnetic fields to the respective magnetic members;

a radio-frequency oscillation circuit (oscillation circuit 21) which supplies a radio-frequency current to the magnetic members; and an AC bias circuit (amplifier 37) which supplies AC bias currents to the respective bias coils, wherein:

the magnetism detection device comprises a first magnetism detection element (first magnetoimpedance element (high sensitivity) 12A) and a second magnetism detection element (second magnetoimpedance element (low sensitivity) 12B) capable of detecting a stronger magnetic field than the first magnetism detection element; and the magnetic field detection sensor generates a signal (SG2) that reflects magnetism detection states of both of the first magnetism detection element and the second magnetism detection element.

[2] The magnetic field detection sensor according to item [1], wherein the magnetic member of the first magnetism detection element and the magnetic member of the second magnetism detection element are electrically connected to each other in series (see FIG. 1).

[3] The magnetic field detection sensor according to item [1], wherein the first magnetism detection element and the second magnetism detection element are arranged adjacent to each other in such a manner that a magnetosensitive axis of the magnetic member of the first magnetism detection element and a magnetosensitive axis of the magnetic member of the second magnetism detection element are parallel with each other (see FIGS. 2 and 3).

[4] The magnetic field detection sensor according to item [1], wherein the magnetic member of the first magnetism detection element and the magnetic member of the second magnetism detection element are connected to each other in series as constituent elements of an electric circuit that constitutes a bridge circuit (22).

[5] The magnetic field detection sensor according to according to item [1], wherein:
the magnetic field detection sensor further comprises a detection circuit (detection unit 30) which outputs an electrical signal that varies according to an impedance (Z) variation from an impedance at a reference point (41r) that corresponds to an external magnetic field being equal to zero and where the magnetism detection device exhibits a maximum impedance in a characteristic (41) of the magnetism detection device; and
the detection circuit comprises an amplitude detection circuit (33) which detects at least amplitudes at peak time points when a voltage variation direction of the electrical signal changes.

What is claimed is:
1. A magnetic field detection sensor, comprising:
a magnetism detection device having magnetic members exhibiting a magnetoimpedance effect and bias coils which apply bias magnetic fields to the respective magnetic members;
a radio-frequency oscillation circuit which supplies a radio-frequency current to the magnetic members;
an AC bias circuit which supplies AC bias currents to the respective bias coils, wherein:
the magnetism detection device comprises
a first magnetism detection element and
a second magnetism detection element capable of detecting a stronger magnetic field than the first magnetism detection element; and
the magnetic field detection sensor generates a signal that reflects magnetism detection states of both of the first magnetism detection element and the second magnetism detection element,
wherein
an impedance of each of the first magnetism detection element and the second magnetism detection element has a characteristic in which the impedance has a maximum value when a strength of an external magnetic field is equal to zero and decreases as the strength of the external magnetic field becomes larger,
the maximum value of the impedance of the first magnetism detection element is larger than the maximum value of the impedance of the second magnetism detection element,
an amount of change of the impedance of the first magnetism detection element relative to a change of the strength of the external magnetic field is larger than an amount of change of the impedance of the second magnetism detection element relative to the change of the strength of the external magnetic field when the strength of the external magnetic field is small including zero,
the amount of change of the impedance of the second magnetism detection element relative to the change of the strength of the external magnetic field is larger than the amount of change of the impedance of the first magnetism detection element relative to the change of the strength of the external magnetic field when the strength of the external magnetic field is large, and
the first magnetism detection element and the second magnetism detection element are connected to each other in series.

2. The magnetic field detection sensor according to claim 1, wherein a magnetic member of the first magnetism detection element and a magnetic member of the second magnetism detection element are electrically connected to each other in series.

3. The magnetic field detection sensor according to claim 1, wherein the first magnetism detection element and the second magnetism detection element are arranged adjacent to each other in such a manner that a magnetosensitive axis of the magnetic member of the first magnetism detection element and a magnetosensitive axis of the magnetic member of the second magnetism detection element are parallel with each other.

4. The magnetic field detection sensor according to claim 1, wherein the magnetic member of the first magnetism detection element and the magnetic member of the second magnetism detection element are connected to each other in series as constituent elements of an electric circuit that constitutes a bridge circuit.

5. The magnetic field detection sensor according to according to claim 1, wherein:
the magnetic field detection sensor further comprises a detection circuit which outputs an electrical signal that varies according to an impedance variation from an impedance at a reference point that corresponds to an external magnetic field being equal to zero and where the magnetism detection device exhibits a maximum impedance in a characteristic of the magnetism detection device; and
the detection circuit comprises an amplitude detection circuit which detects at least amplitudes at peak time points when a voltage variation direction of the electrical signal changes.

* * * * *